(12) United States Patent
Halm

(10) Patent No.: US 7,561,984 B2
(45) Date of Patent: Jul. 14, 2009

(54) METHOD FOR CALCULATING A MODEL SPECTRUM

(75) Inventor: Christian Halm, Jena (DE)

(73) Assignee: Vistec Semiconductor Systems Jena GmbH, Jena (DE)

( * ) Notice: Subject to any disclaimer, the term of this patent is extended or adjusted under 35 U.S.C. 154(b) by 66 days.

(21) Appl. No.: 11/655,984

(22) Filed: Jan. 22, 2007

(65) Prior Publication Data

US 2007/0171429 A1 Jul. 26, 2007

(30) Foreign Application Priority Data

Jan. 25, 2006 (DE) .................. 10 2006 003 473

(51) Int. Cl.
*G06F 19/00* (2006.01)
(52) U.S. Cl. ..................... 702/170; 702/172
(58) Field of Classification Search ............... 702/170, 702/172; 170/172
See application file for complete search history.

(56) References Cited

U.S. PATENT DOCUMENTS 6,826,511 B2 * 11/2004 Mikkelsen et al. .......... 702/172
6,985,237 B2   1/2006 Mikkelsen et al.

FOREIGN PATENT DOCUMENTS

DE   102 04 943 A1   8/2003
DE   102 27 376 A1   1/2004

OTHER PUBLICATIONS

U.S. Appl. No. 11/655,985, filed Jan. 22, 2007, Halm.
H. G. Tompkins et al., "Spectroscopic Ellipsometry and Reflectometry, A User's Guide," 1999, pp. 6-22.

* cited by examiner

*Primary Examiner*—Edward R Cosimano
*Assistant Examiner*—Douglas N Washburn
(74) *Attorney, Agent, or Firm*—Foley & Lardner LLP

(57) ABSTRACT

With technical surfaces, in particular in semiconductor manufacture, it is a regular requirement to determine the reflection coefficient. For this purpose, a model spectrum of an object of a plurality of wavelengths and a defined number of intermediate points is calculated. To increase the calculating speed, the defined number of intermediate points is calculated prior to the execution of the calculation.

7 Claims, 2 Drawing Sheets

METHOD FOR CALCULATING A MODEL SPECTRUM

CROSS REFERENCE TO RELATED APPLICATIONS

This patent application claims priority of German Patent Application No. 10 2006 003 473.2, filed on Jan. 25, 2006, which application is incorporated herein by reference.

FIELD OF THE INVENTION

The present invention relates to a method for calculating a model spectrum of an object, having a multilayer system.

BACKGROUND OF THE INVENTION

With technical surfaces, in particular in semiconductor manufacture, it is often necessary to determine the structural parameters of the surface. During the manufacturing process, applied line widths and line profiles of structured layers must be checked, for example, with respect to their dimensions and uniformity. The exact compliance with specifications for layer thicknesses is critical for the operativeness of the product. To check these manufacturing parameters the reflection on the sample is measured at different wavelengths. These measurements do not directly provide, however, the desired material data, such as the above-mentioned layer thickness. Rather, it is necessary to match the calculated values to measured values and to calculate a theoretical spectrum with the aid of a model using the theory of light scattering, and to compare it with the measurement. Subsequently, model parameters are changed until there is a best match between theory and measurement.

Reflection spectroscopy is a well-known and widely used method for inspecting layered systems, in particular of wafers, and for determining layer thicknesses and other optical parameters. To do this, a sample, preferably comprising a plurality of layers, is irradiated with light of a predetermined wavelength. If the layers are transparent in the range of this wavelength, light penetrates the layer and is partially reflected at the interfaces between two layers including the interface between the top layer and the ambient atmosphere. By overlapping the incident and reflected light beams, an interference results which affects the intensity of the reflected light. The ratio of the intensities of incident and reflected light thus determines the so-called absolute reflectance so that the two intensities have to be measured. If the wavelength is now continuously varied in a predetermined range, the reflection spectrum is obtained, which has maxima and minima as a function of the wavelength. These are caused by interference. The position of these extrema depends on the material properties of the sample inspected. The latter therefore determines the optical behavior. These optical parameters include the refractive index or the coefficient of absorption. Further, the layer thickness affects the position of the extrema in the reflection spectrum.

The basic formulae which are used to calculate the desired quantities from the comparison of the model with the measurement can be derived from Fresnel's diffraction theory. These are described, for example in "Spectroscopic Ellipsometry and Reflectometry—A users Guide" by H. G. Tompkins and W. A. McGahan.

The basic equations are summarized in the following. Equation (1) describes the wave function on a simple surface, i.e. on an interface between two media having different, complex, where applicable, dispersions.

$$r^p_{12} = \frac{\tilde{N}_2 \cdot \cos\phi_1 - \tilde{N}_1 \cdot \cos\phi_2}{\tilde{N}_2 \cdot \cos\phi_1 + \tilde{N}_1 \cdot \cos\phi_2} \text{ and} \quad (1)$$

$$r^s_{12} = \frac{\tilde{N}_1 \cdot \cos\phi_1 - \tilde{N}_2 \cdot \cos\phi_2}{\tilde{N}_1 \cdot \cos\phi_1 + \tilde{N}_2 \cdot \cos\phi_2}$$

If there is a further medium, this is referred to as a simple layer or a film having the thickness d. For this model, too, the reflection R can be indicated using a closed formula for each of the polarization planes s and p (Eq. 2).

$$R^p = \frac{r^p_{12} + r^p_{23} \cdot \exp(-j2\beta)}{1 + r^p_{12} \cdot r^p_{23} \cdot \exp(-j2\beta)} \text{ and} \quad (2)$$

$$R^s = \frac{r^s_{12} + r^s_{23} \cdot \exp(-j2\beta)}{1 + r^s_{12} \cdot r^s_{23} \cdot \exp(-j2\beta)}$$

It is composed of the Fresnel coefficient (equation 1) of the two interfacing layers and a complex e-function, wherein the indices 1 and 2 must be replaced by 2 and 3 for the lower interfacing layer.

In $$\beta = 2\pi\left(\frac{d}{\lambda}\right)\tilde{N}_2 \cos\phi_2 \quad (3)$$

the e-function has the complex optical thickness $d \cdot \tilde{N}$ as an argument and, with its periodicity, it describes the oscillating behavior of the reflection, which results from interferences within the film.

$$\tilde{N}_2 = n_2 - j \cdot k_2 \quad (4)$$

The values for the dispersion $\tilde{N}$ is also complex, as is that of the cosine function $\cos \Phi_2$.

The measurable reflection on the surface is calculated separately for vertically and horizontally polarized light from the values of the wave functions according to the equations (5).

$$R^p := |R^p|^2 = \left(\sqrt{(R^p_x)^2 + (R^p_y)^2}\right)^2 = (R^p_x)^2 + (R^p_y)^2 \text{ and} \quad (5)$$

$$R^s := |R^s|^2 = (R^s_x)^2 + (R^s_y)^2$$

With an equal distribution of the polarizations in the incident light, the whole of the unpolarized reflection is given by the arithmetic mean according to equation (6).

$$R := \frac{R^p + R^s}{2} \quad (5)$$

Snell's law also applies for the complex sine function $$\tilde{N}_{i+1} \cdot \sin \phi_{i+1} = \tilde{N}_i \cdot \sin \phi_i, \quad (7)$$

so that for the incident angle of the i-th layer $$\sin\phi_{i+1} = \sin\phi_i \cdot \frac{\tilde{N}_i}{\tilde{N}_{i+1}} \quad (8)$$

$$= \sin\phi_{i-1} \cdot \frac{\tilde{N}_{i-1}}{\tilde{N}_i} \cdot \frac{\tilde{N}_i}{\tilde{N}_{i+1}}$$

$$= \sin\phi_0 \cdot \frac{\tilde{N}_0}{\tilde{N}_{i+1}}$$

applies. The medium surrounding the layered system is usually air. With a real $\Phi_0$, sin $\Phi_0$ is also real, since for $\Phi_0$, only $n_0$ is taken into account, and not $k_0$. $\Phi_1$ can take on a complex value, however, when $\tilde{N}_0$ or $\tilde{N}_1$ are complex. With sin $\Phi_0$ known, sin $\Phi_{i+1}$ can be calculated for all layers. cos $\Phi_i$, which is required for calculating the optical parameters, with (sin $\Phi_i)^2+(\cos \Phi_i)^2=1$, results in:

$$\cos\phi_i = \sqrt{1-(\sin\phi_i)^2} \quad (9)$$

In this context, reflection refers to the ratio of the outgoing intensity and the incoming intensity. It is calculated separately for the two polarization planes, "s" referring to vertical and "p" referring to parallel. The intensity in turn is proportional to the square of the amplitude of the light wave function.

The matching of a theoretically calculated curve to a measured curve with the aid of a model of variable parameters will be referred to as a fit in the following. To do this, the model parameters are varied in such a way that there is a best match between the theoretical curve and the measured curve. To achieve a good result, it is therefore often necessary to calculate many theoretical curves, which is very time intensive. To reduce this expenditure of time, it is suggested for example in DE 102 04 943 that the optimization criterion be determined by using the totality of the values of the wavelength differences of all pairs of wavelengths. Herein a pair of wavelengths is formed by those wavelengths which correspond to a selected extremum in the measured reflection spectrum. Herein the extrema are provided with an index in a rising or falling order. The comparison is then made with that extremum which has the same index in the modeled reflection spectrum.

The standard method for a fit is the so-called gradient method, since it enables the exact result to be found quickly. A precondition herefor is that the starting point is already near the solution. If the model is only known imprecisely, however, it is necessary to find this starting point. Otherwise the gradient method leads to a side minimum, without the error being clearly distinguishable. An upstream method, the so-called constant mesh method, fulfills this task. Herein, each parameter to be fitted is screened in a predetermined interval at a predetermined pitch. If, for example, a layer thickness is to be determined by a fit and it is known that a layer with a thickness of about 1000 nm is present, an interval and a suitable pitch can be determined with the aid of an automatic process, the so-called autoranger. The approach for this is described, for example, in DE 102 27 376 A1.

For a nominal value of the layer thickness of 1000 nm, there results an interval of 382.74 nm to 1617.25 nm at a pitch of 17.14 nm. The constant mesh then calculates the resulting 73 spectra and the MSE for each case. The layer thickness with the smallest MSE will then be the starting value for the gradient method. If more than one parameter is to be fitted the overall number of the spectra to be calculated results from the product of the number of spectra per parameter. With three layer thicknesses per 73 spectra, the result is as many as 73*73*73=389,017 spectra. For calculation three nested loops are necessary. It is to be seen that as the number of parameters to be varied increases, the calculation overhead strongly increases. When using the analysis with production control, time is the limiting factor. The more spectra that can be calculated within a predetermined period of time, the more parameters can be varied. The intervals for which the solution is assumed can then also be chosen to be larger, which results in a greater probability of a hit.

It can be seen that the duration of the calculation also essentially depends on the pitch, i.e. on the number of intermediate points used. To be able to achieve a match of the measured spectrum to the model spectrum which is as good as possible, according to the prior art, it is usually chosen according to the number of intermediate points in the measured spectrum.

SUMMARY OF THE INVENTION

It is an object of the present invention to provide a method for calculating the model spectrum, which makes it possible to obtain the result more quickly.

This object is solved according to the present invention by a method for calculating a model spectrum having the features: calculating the model spectrum with a plurality of wavelengths and a defined number of model intermediate points ($N_{mod}$), and calculating prior to the execution of the calculation of the model spectrum, the defined number ($N_{mod}$) of model intermediate points.

According to the present invention, a method for calculating a model spectrum of an object, in particular a multilayer system, is suggested. Herein, the model spectrum is calculated from a plurality of wavelengths and a defined number of model intermediate points. Prior to carrying out the calculation, however, first the defined number of model intermediate points, which are actually necessary for calculating the model spectrum depending on the measured spectrum, is calculated.

In a first embodiment of the present invention, it is checked, as a criterion for the number of required model intermediate points, whether the measured spectrum is sufficiently smooth, at least partially. If this is the case, the number of intermediate points present in the measured spectrum can be reduced. For checking whether the spectrum is sufficiently smooth, a so-called smoothness value can be determined, and the determined smoothness value can be compared with a predetermined required minimum value for the smoothness. The smoothness value of the measured spectrum can be determined by determining the value of the difference of the values of two neighboring intermediate points for all intermediate points and dividing it by the average value of the spectrum. Alternatively, the smoothness value can be determined by determining the maximum of the difference of the values of two neighboring intermediate points for all intermediate points.

In another embodiment of the invention, for determining the number of required model intermediate points, the optical thicknesses of the layer stack are determined. To do this, the mean value of the dispersion within the predetermined analysis range is calculated for all layers without the substrate and without the ambient. This allows the optical layer thickness to be calculated, in particular together with the nominal value of the layer thickness. Subsequently, the sum is formed over all optical layer thicknesses. The calculation of $\Delta\lambda$ and the determination of a number of desired intermediate points per period then allows the number of model intermediate points which is necessary for the multilayer system in question to be calculated, without an inacceptable error arising.

BRIEF DESCRIPTION OF THE DRAWINGS

Further advantages and advantageous embodiments of the present invention will be described with reference to the accompanying drawings, in which.

DETAILED DESCRIPTION OF THE INVENTION

When model spectra are calculated and therefore the total reflection coefficient is calculated, the choice of the number of model intermediate points usually used corresponds to the number of those in the measured spectrum; this is because the measured spectrum is the reference to which the model spectrum is compared. For calculating the total reflection of a model, it is based on an object which has a plurality of layers. Herein, for simplicity, the material surrounding the layers, the so-called ambient, and the substrate, i.e. the material on which the layers are applied, are also referred to as layers, even though their thickness is unknown and also irrelevant, because the only thing that is relevant in the present context is the dispersion. This is why for all wavelengths the required calculations are carried out first, followed by those for all model intermediate points.

Figure 1:
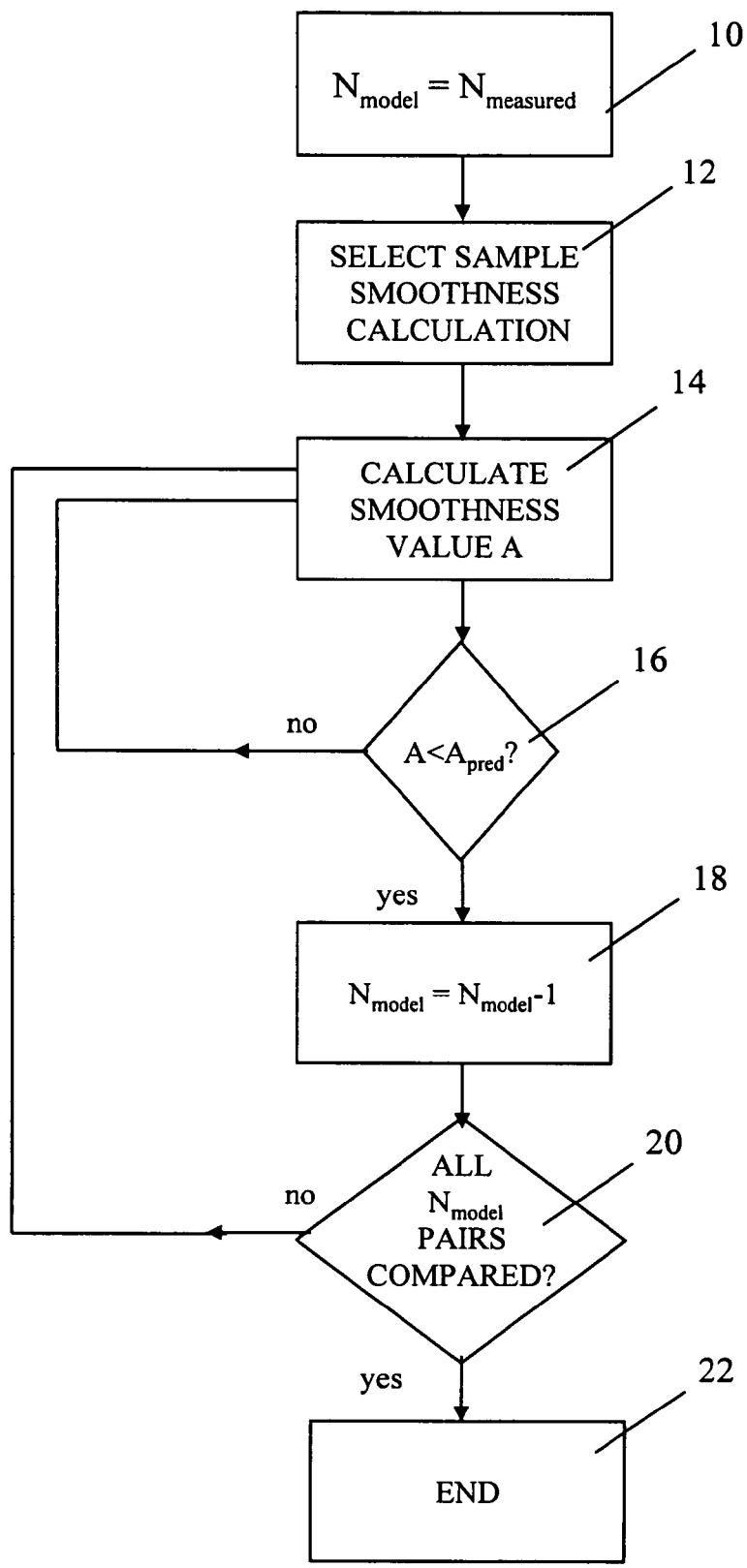
FIG. 1 schematically shows the sequence of method steps according to a first embodiment of the invention.

As schematically shown in FIG. 1, according to the present invention, initially the number of model intermediate points necessary for the calculation is determined by checking whether the measured spectrum is sufficiently smooth, at least partially. This is because in the present case, the number of the model intermediate points can be reduced when compared to the number of measured intermediate points, and therefore the calculation overhead can be reduced. A precondition is therefore that the measured spectrum is sufficiently smooth.

Step 10 begins with a value for the number of model intermediate points $N_{model}$ which is equal to the number of measured intermediate points $N_{measured}$. For calculating the required value $N_{model}$, it is initially checked or selected in step 12, the calculation of which is to be chosen for the quality "sufficiently smooth". This is because the value of the difference of the values of two neighboring intermediate points can be averaged for all intermediate points on any kind of spectrum, and then divided by the average value of the spectrum. The result is a value A, which is referred to as a smoothness value in the following:

$$A = \frac{1}{N-1}\sum_{i=1}^{N-1} |R_{i+1} - R_i|, \quad (10)$$

The smoothness value is a measure for the smoothness of the measured spectrum. Alternatively, the smoothness value A can also be calculated from $$A = \max(|R_{i+1} - R_i|) \, mit \, \forall i \in \{1, N-1\} \quad (11)$$

wherein, compared with equation (10), the maximum from the difference is used instead of the average value.

In the smoothness calculation step 14, the smoothness value A is now calculated according to the selection step 12. In comparison 16, it is then checked whether or not the thus calculated smoothness value A falls short of a predetermined value $A_{pred}$. If this is not the case, the process continues with the next measured intermediate point pair in calculation step 14. However, if A is smaller than $A_{pred}$, the measured spectrum is sufficiently smooth between the two intermediate points analyzed, and the number of model intermediate points $N_{model}$ will be reduced by one with $$N_{model} = N_{model} - 1$$

in reduction step 18. It is then checked in step 20 whether or not the calculation has been carried out for all measured intermediate point pairs. If this is not the case, the process continues with the next measured intermediate point pair in calculation step 14. Otherwise, in this way the number of model intermediate points $N_{model}$ is obtained in step 22. In the determination of $N_{model}$, a minimum number can also be fixed, in particular, if the number is substantially reduced with respect to the measured spectrum. For example, it can be determined, that at least one out of five intermediate points of the measured spectrum is used for calculating the model spectrum.

Figure 2:
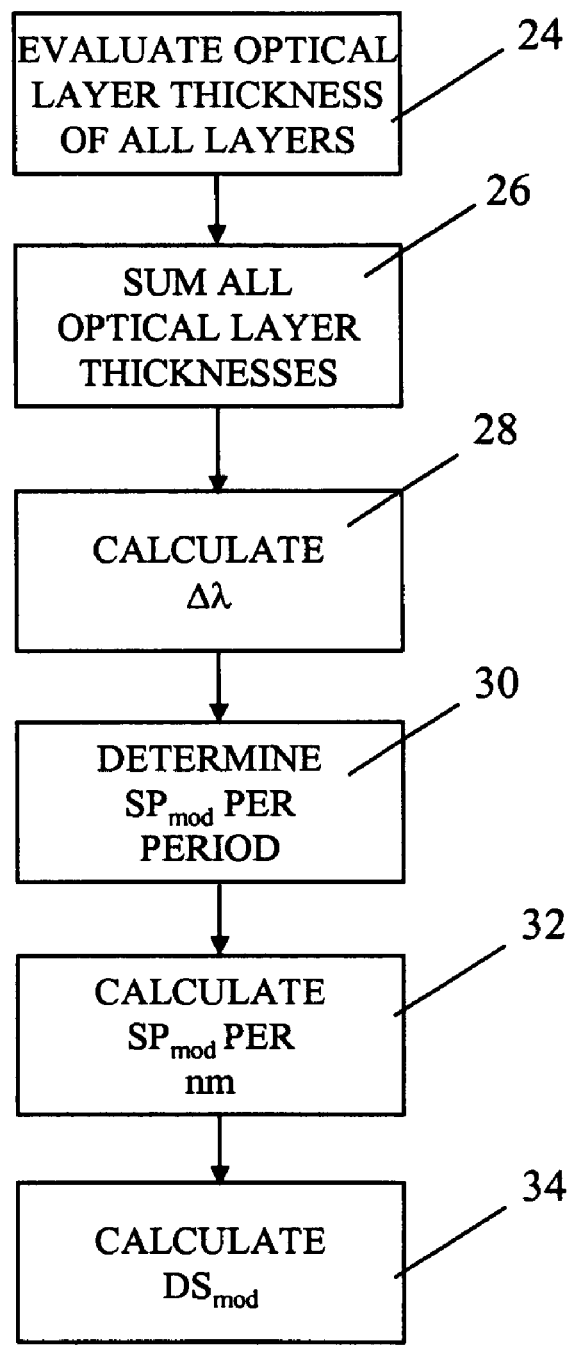
FIG. 2 schematically shows the sequence of process steps according to a second embodiment of the invention.

In FIG. 2, an alternative approach for determining the number of model intermediate points $N_{model}$ is shown. Here it is assumed, that the smoothness of reflection spectra can also be calculated; this is because strong variations in the spectrum in the form of oscillations appear due to interference within thick layers of the multilayer system. By calculating the optical thickness $d \cdot \tilde{N}$ of the multilayer system beforehand, a value can be determined which indicates how many model intermediate points are required for a calculation without an inacceptably large error arising in the calculation of the model spectrum. In this calculating method it is assumed that the wavelength difference $\Delta\lambda$ of two maxima depends on the wavelength itself. The maxima are closest to each other with the smallest wavelength of the analysis range. The distance is calculated as follows (see equation 12):

$$\Delta\lambda = \frac{\lambda_{min}^2}{\tilde{N} \cdot d \cdot \cos\phi - \lambda_{min}}. \quad (12)$$

Since the individual layers can also act as a single thick layer (with a similar dispersion of the layers), the thickness of which is equal to the sum of the thicknesses of the individual layers, the sum of the above calculated optical layers is substituted in the formula as a more stringent condition for the optical thickness $\tilde{N} \cdot d$.

Initially, $\Delta\lambda$ is calculated with equation 12, and the sum of all optical layer thicknesses is substituted as the optical layer thickness. Then the number of intermediate points per period is set. For example, if there is to be an intermediate point every 15 degrees, there will be 360/15=24 intermediate points per period. Then the number of intermediate points per nm is calculated as:

Number of intermediate points per nm=24/$\Delta\lambda$.

These lines are from a calculation in which additional intermediate points are needed in the FFT calculation. Here, however, intermediate points should be eliminated. If one substitutes $\lambda_{min}$=500 nm and $\tilde{N} \cdot d \cdot \cos \phi$=4000 nm, in equation 12, one obtains 71.43 nm as the distance between two maxima. In this interval there are 71 odd measuring values, but only 24 intermediate points are needed, i.e. each 2.9-th measuring value. To be on the safe side, the value is rounded down and only every other measuring value is used, which halves the calculating overhead.

The reciprocal indicates the values sought after—how large the distance of the intermediate points needs to be (in nm) on the outside, without obtaining a noticeable error. If it is to be smaller than the determined distance of the intermediate points of the measured spectrum, no time economy is possible, and the determined number is maintained. If it is to be substantially larger, an upper limit can be introduced, so that, for example, at least one out of five determined intermediate points must be used.

A difference of precisely one oscillation must exist for the distance of two maxima, i.e. the exponent from equations (2) and (3) must have changed by $2\pi$. We therefore get:

$$\beta_{Max1} - \beta_{Max2} = 2\pi\left(\frac{d}{\lambda_{Max1}}\right)\tilde{N}\cos\phi - 2\pi\left(\frac{d}{\lambda_{Max2}}\right)\tilde{N}\cos\phi = 2\pi, \quad (13)$$

wherein $\lambda_{max2} > \lambda_{max1}$, and it is assumed as a simplification that $\tilde{N}$ does not change with the wavelength during this interval.

With $$\Delta\lambda := \lambda_{Max2} - \lambda_{Max1} > 0 \quad (14)$$

one obtains the distance sought after by way of transformation:

$$\Delta\lambda = \frac{\lambda_{Max1}^2}{\tilde{N}\cdot d\cdot\cos\phi - \lambda_{Max1}}. \quad (15)$$

This is how the number of the required model intermediate points can also be calculated with the approach as shown in FIG. 2. Initially the average value of the dispersion n is calculated within the analysis range for all layers without the substrate and without the ambient in step 24. Together with the nominal value of the layer thickness which corresponds to the starting value of the model, this results in the optical layer thickness $d\cdot\tilde{N}$ for each layer. By adding all optical layer thicknesses, the optical layer thickness of the overall multilayer system is obtained in step 26. $\Delta\lambda$ can now be calculated with the aid of equation (15) in step 28, wherein the sum of all optical layer thicknesses is substituted as the optical layer thickness. This is possible since the individual layers can also act as a single thick layer, in particular with similar dispersion of the individual layers. The thickness of all layers, however, is equal to the sum of all thicknesses of the individual layers.

It is now determined by the user in step 30 how large the number $SP_{mod}$ of the desired intermediate points should be per period in the model spectrum. This number can also be prestored and read out. For example, if every 15 degrees an intermediate point should be provided, this results in 360/15=24 intermediate points per period. In step 32, the number of intermediate points $SN_{mod}$ per nm in the model spectrum is calculated with:

$$SN_{mod} = 24/\Delta\lambda$$

This value is then rounded up to an integer number and reduced by one in order to take into account that one intermediate point is already present. In step 34 the reciprocal $DS_{mod}$ of this number is formed, which indicates how large the distances of the intermediate points should be in nm, on the outside, without there being unacceptable errors. If the value is to be smaller than the given distance of the intermediate points of the measured spectrum, no time economy is possible, and the given number is maintained. If it is to be substantially larger, an upper threshold can be provided, so that, for example, at least one out of five given intermediate points must be used.

The imprecisions described with this method are temporarily acceptable since no other result can be obtained with the use of an optimizing method, for example, a gradient method. It is particularly advantageous in the method as suggested according to the present invention, that initially a somewhat imprecise value can be used for calculation. A troublesome calculation requiring many spectral calculations and in which the target value is first roughly approached can therefore be eliminated.

What is clamed is:

1. A method for calculating a model spectrum of an object, having a multilayer system, comprising the steps of:
    calculating the model spectrum with a plurality of wavelengths and a defined number of model intermediate points ($N_{mod}$);
    calculating prior to the execution of the calculation of the model spectrum, the defined number ($N_{mod}$) of model intermediate points, wherein for determining the defined number ($N_{mod}$) of model intermediate points, the optical thicknesses $\tilde{N}\cdot d$ of the multilayer system are determined beforehand,
wherein
    for all layers of the multilayer system, without the substrate and without the ambient, the mean value of the dispersion n within the predetermined analysis range is calculated and the optical layer thickness is calculated, in particular together with the nominal value of the layer thickness, and
    subsequently the sum of all optical layer thicknesses is formed.

2. The method according to claim 1, wherein the defined number ($N_{mod}$) of model intermediate points is determined by checking whether or not the measured spectrum is sufficiently smooth, at least partially.

3. The method according to claim 2, wherein for determining the defined number ($N_{mod}$) of model intermediate points, a smoothness value (A) is determined, wherein the value of the difference of the values of two neighboring intermediate points is determined for all intermediate points and divided by the average value of the spectrum.

4. The method according to claim 2, wherein for determining the defined number ($N_{mod}$) of model intermediate points, a smoothness value (A) is determined, wherein the maximum of the difference of the values of two neighboring intermediate points is determined for all intermediate points.

5. The method according to claim 1, wherein it is determined by the user, how many model intermediate points there should be per period ($SP_{mod}$) and it is calculated with the equation $SN_{mod} = SP_{mod}/\Delta\lambda$, how many model intermediate points should be provided per nm ($SN_{mod}$), wherein $\Delta\lambda$ is the wavelength difference.

6. The method according to claim 5, wherein the wavelength difference $\Delta\lambda$ is determined with the equation $$\Delta\lambda = \frac{\lambda_{Max1}^2}{\tilde{N}\cdot d\cdot\cos\phi - \lambda_{Max1}}.$$

7. The method according to claim 6, wherein the obtained value ($SN_{mod}$) for the number of intermediate points per nm is rounded up to an integer, then reduced by one, and then, by forming the reciprocal ($DS_{mod}$) of this number, greatest distances are determined that the intermediate points need to be apart from each other, without obtaining any noticeable errors.

* * * * *